United States Patent [19]
Gammon

[11] Patent Number: 5,847,938
[45] Date of Patent: Dec. 8, 1998

[54] PRESS-FIT SHIELDS FOR ELECTRONIC ASSEMBLIES, AND METHODS FOR ASSEMBLING THE SAME

[75] Inventor: John Weldon Gammon, Raleigh, N.C.

[73] Assignee: Ericsson Inc., Research Triangle Park, N.C.

[21] Appl. No.: 770,823

[22] Filed: Dec. 20, 1996

[51] Int. Cl.$^6$ ........................................ H05K 9/00
[52] U.S. Cl. .................... 361/816; 361/752; 361/779; 361/800; 361/814; 361/818; 174/35 R; 174/35 GE; 455/90; 455/300
[58] Field of Search .................... 361/732, 740, 361/752, 799, 800, 801, 813, 814, 816, 818; 174/35 R, 35 GE; 257/728; 455/90, 300; 379/433, 428, 434, 438

[56] References Cited

U.S. PATENT DOCUMENTS

| | | | |
|---|---|---|---|
| 4,370,515 | 1/1983 | Donaldson | 174/35 R |
| 4,754,101 | 6/1988 | Stickney et al. | |
| 4,857,668 | 8/1989 | Buonanno | 174/35 GC |
| 5,252,782 | 10/1993 | Cantrell | 174/35 R |
| 5,354,951 | 10/1994 | Lange, Sr. et al. | |
| 5,508,889 | 4/1996 | Li | 361/816 |
| 5,557,063 | 9/1996 | Mottahed | 174/35 R |
| 5,579,212 | 11/1996 | Albano et al. | 361/820 |

FOREIGN PATENT DOCUMENTS

| | | | |
|---|---|---|---|
| 5-82983 | 4/1993 | Japan | 361/818 |

OTHER PUBLICATIONS

"Announcing Printed Circuit Board Shielding from Instrument Specialities . . . an economical solution to your board level emission problems", New Product Bulletin (Series 97–2000), Instrument Specialties, 4 pages.

"Cho–Shield® EMI Shielding Covers", Technical Bulletin, Chomerics, Inc. (1996), 2 pages.

"Style CBS Circuit Board Component Shielding", Guide 96, Leader Tech, pp. 1–6.

*Primary Examiner*—Leo P. Picard
*Assistant Examiner*—Phuong T. Vu
*Attorney, Agent, or Firm*—Myers Bigel Sibley & Sajovec, P.A.

[57] ABSTRACT

A shield including a cover and pins is inserted in a solder-free connection into an electronic substrate for shielding electronic components on the substrate in an electronic device. The shield has a conductive cover, preferably with an integrally formed roof and wall, which defines a cavity. The cavity is configured to receive an electronic component or components positioned therein. The shield also has a conductive mounting pins which extend from the cover. The cover and the pins are preferably formed as a single piece. The shield also preferably includes a conductive gasket connected in a groove in the cover between the cover and the electronic substrate. Methods of assembling the shield on an electronic substrate in forming an electronic package for an electronic device are also provided.

25 Claims, 4 Drawing Sheets

PRESS-FIT SHIELDS FOR ELECTRONIC ASSEMBLIES, AND METHODS FOR ASSEMBLING THE SAME

FIELD OF INVENTION

This invention relates to shields for minimizing interference of components in electronics. More particularly, this invention relates to shields for minimizing interference including radio frequency interference and electromagnetic interference and methods of assembling such shields in electronic devices.

BACKGROUND OF INVENTION

In various electronics applications, electronic components must be protected from electromagnetic radiation and interference. Various types of electronics including cellular phones, computers, receivers, transmitters and other devices have components which emit or require shielding from radio frequency interference (RFI) and electromagnetic interference (EMI). Susceptible components are generally shielded to protect against RFI or EMI problems or interference from other components, as well as from the environment surrounding the electronic device. Shielding certain of such electronic components with a metal shield is desirable. Such shielding is generally grounded to dissipate electrical charges and fields, and thereby not impair the function of the electronic components within the shields.

Various types of shielding devices for electronic components have been described. Many of these shields have included a base wall soldered, screwed or permanently fastened to an electronic component and a separate lid which attaches to the base wall for shielding. Such lids are frequently cumbersome or difficult to assemble with the base wall onto the electronic device during manufacture. These lids can loosen or disconnect under vibration, shock and movement. Such shields are typically supplied in limited, prefabricated sizes and shapes which can drive device design. Such limits of the shields may restrict the positions in which the circuit components can be positioned on the electronic device. These shields also generally require space for soldering of the wall onto the device. Further, space must generally be left for testing of the components after the wall is soldered to the electronic device.

An example of a multiple piece shielding device for a circuit board having a separate base and lid can be seen in U.S. Pat. No. 5,354,951 to Lange, Sr. et al. ("the Lange '951 patent"). The Lange '951 patent describes an elongated steel fence enclosure comprising a plurality of walls and a steel cover which connects into tabs in the fence walls. The Lange '951 patent describes soldering pins of the walls into the circuit board and then assembling the lid with the pieces of the walls within one another. Further, the Lange '951 patent illustrates aligning the sections of the walls on the board, with one another and with the lid to properly connect and retain the walls in place during use. U.S. Pat. No. 4,754,101 to Stickney et al. describes a shield having metal walls and a metal cover plate which connects into the walls. The walls and cover plate are described as soldered and welded. The walls are illustrated as soldered onto a circuit board to solder and hold the shield in place.

Other attempts to shield electronic components have illustrated shields which fit or attach into the housing of the electronic device. These shields are inserted or molded onto the inside walls of the housing for an electronic device to form a shield. Precise placement of the shield in the housing may be desirable which can be labor intensive and difficult to assemble. Further, the components may not be shielded against other components within the housing of the device.

Functional testing, including shielding effectiveness, is typically, and often mandatorily, performed on the electronic components of many devices. Testing may be required in certain devices by industry and government standards such as FCC regulations. Other testing is undertaken to assure certain desired performance criteria for the device. When certain electrical devices or components fail these tests, reworking of the device and components can be required. Shields soldered to electronic substrates generally are removed for reworking, adding increased costs, labor requirements and difficulty to the manufacturing process. If shield walls are left attached, sufficient space may need to be left between the boundary of the walls and the components for the insertion of probes and other instruments to test components within the boundary of the walls. Shields within housings may require the housing to be removed for reworking, also adding manufacturing steps and costs to the process.

As electronic components and devices continue to be miniaturized, additional handling, reworking and assembly steps often become increasingly more difficult, expensive and time consuming. Also, as electronic components and devices miniaturize, space requirements and demands may be limited in the design of the electronic device and components. Limited space may be available for shielding in such devices. Prior shields may use excessive space on the circuit board or other electronic substrate for soldering or attaching the shield to the substrate with fasteners such as screws. Soldering and fastening may also be difficult and may require various tools and materials, particularly in miniaturized components and devices.

Also, during soldering, solder can migrate and damage electronic components. A buffer space is often used between the shielding device and components to prevent such damage which may further limit available space for components and working on the electronic substrate. As certain devices may use multiple shields, additional space may be needed for attaching, soldering and testing using multiple shields.

Therefore, there is a need for shields which reduce space requirements for the shield, facilitate performance of functional tests on the electronic device such as a circuit board, and are easy to connect and remove from an electronic substrate.

SUMMARY OF THE INVENTION

It is therefore an object of the invention to provide shields which can be easily connected and disconnected from an electronic substrate such as a printed circuit board.

It is an object of the invention to provide shields which can reduce the boundary space around the shields needed for assembly or testing.

It is also an object of the invention to provide shields which facilitate functional testing of the electronic components or devices.

These and other objects, advantages and features are provided, according to the invention, by press-fit shields for electronic components which can be press-fit onto, and easily removed from, an electronic substrate. The shields are preferably one piece and preferably do not require soldering. Accordingly, the shields can reduce the boundary space which is needed for assembly and can be removed for functional testing.

In particular, shields are provided comprising a conductive cover which defines a hollow cavity configured to receive an electronic component positioned herein. The conductive cover preferably includes a roof and a wall integrally formed with the roof. Shields according to the invention also include a plurality of conductive mounting pins which extend from the cover. The cover and the pins, are preferably formed or molded as a single piece.

The pins are configured to form a solder-free connection with a surface of an electronic substrate and to releasably, electrically couple with a ground plane of the electronic substrate. The pins are also preferably self-locating having a tapered end to assist in inserting the shield into the electronic substrate. The pins preferably extend through holes in the electronic substrate such that the distal ends are accessible from the opposite surface of the electronic substrate for removal of the shield.

Shields according to the invention preferably include a peripheral end which defines the outer boundary of the inner cavity and a conductive gasket connected with the peripheral end. The gasket is configured to be positioned between the peripheral end of the cover and the electronic substrate. Alternatively, a groove can be provided in the peripheral end and the gasket can be connected in the groove.

As described, the shields can be releasably press-fit-inserted into a surface of electronic substrates to provide electronic packages. The plurality of conductive mounting pins are inserted into the surface of the electronic substrate in a solder-free connection and releasably electrically coupled with the ground plane of the electronic substrate. The electronic package can be enclosed in a housing surrounding the package including the shield to provide an electronic device.

Methods of assembling electronic packages are also provided including the following steps. A surface of an electronic substrate is populated with a plurality of electronic components. A shield is then press-fit inserted on the surface of the electronic substrate with at least one electronic component positioned in the inner cavity of the shield to provide an electronic package.

Functional tests are then performed on the shielded electronic components. The shield can then be removed, preferably by contacting the pins from the surface of the electronic substrate opposite the surface having the shield inserted therein. The electronic package can then be reworked as desired.

The shield can then be reinserted into the electronic substrate with the electronic component or components positioned in the inner cavity. The electronic package can then be enclosed in a housing to provide an electronic device such as a cellular phone. Alternatively, a new shield can be inserted into the same electronic substrate with the electronic component positioned in the inner cavity, and then enclosed in a housing to provide an electronic device.

Thus, a shield is provided which can be easily press-fit inserted into an electronic substrate to provide an electronic package for an electronic device. The electronic package can be covered by a variety of housings to provide a variety of electronic devices such as cellular phones, pagers, portable compact disk players, and the like. Additionally, the shield can be easily press-fit inserted and removed to expose the electronic substrate as necessary. With the shield being press-fit inserted without any solder or fasteners, the space devoted to shielding can be reduced. Thus, components can be positioned close to the walls of the shield. Additionally, multiple shields can be positioned directly adjacent one another or the components without needing a boundary between adjacent shields.

DETAILED DESCRIPTION OF THE DRAWINGS

The present invention now will be described more fully hereinafter with reference to the accompanying drawings, in which preferred embodiments of the invention are shown. This invention can, however, be embodied in many different forms and should not be construed as limited to the embodiments set forth herein; rather, Applicants provide these embodiments so that this disclosure will be thorough and complete, and will fully convey the scope of the invention to those skilled in the art.

Figure 1:
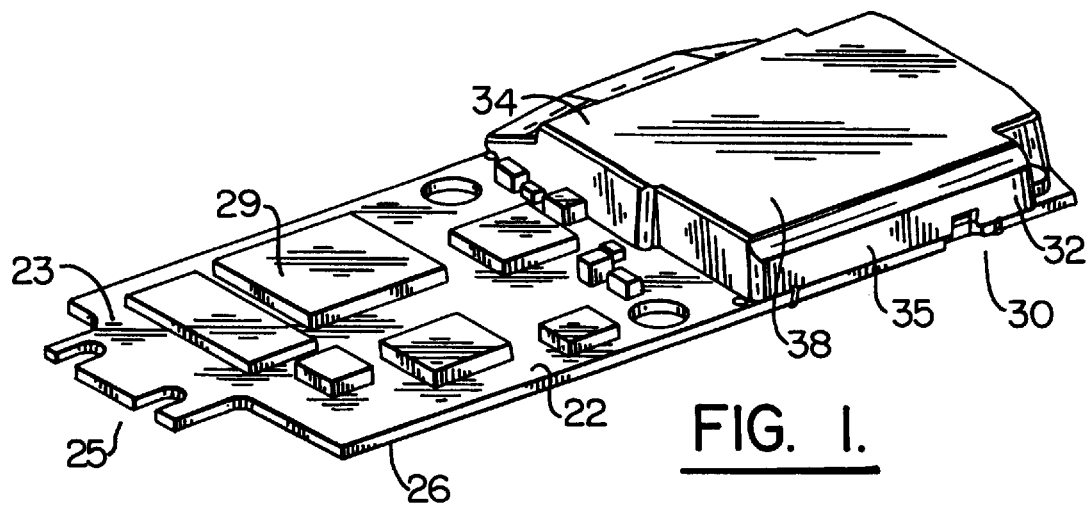
FIG. 1 is a perspective view of a shield releasably mounted on a circuit board.
Figure 2:
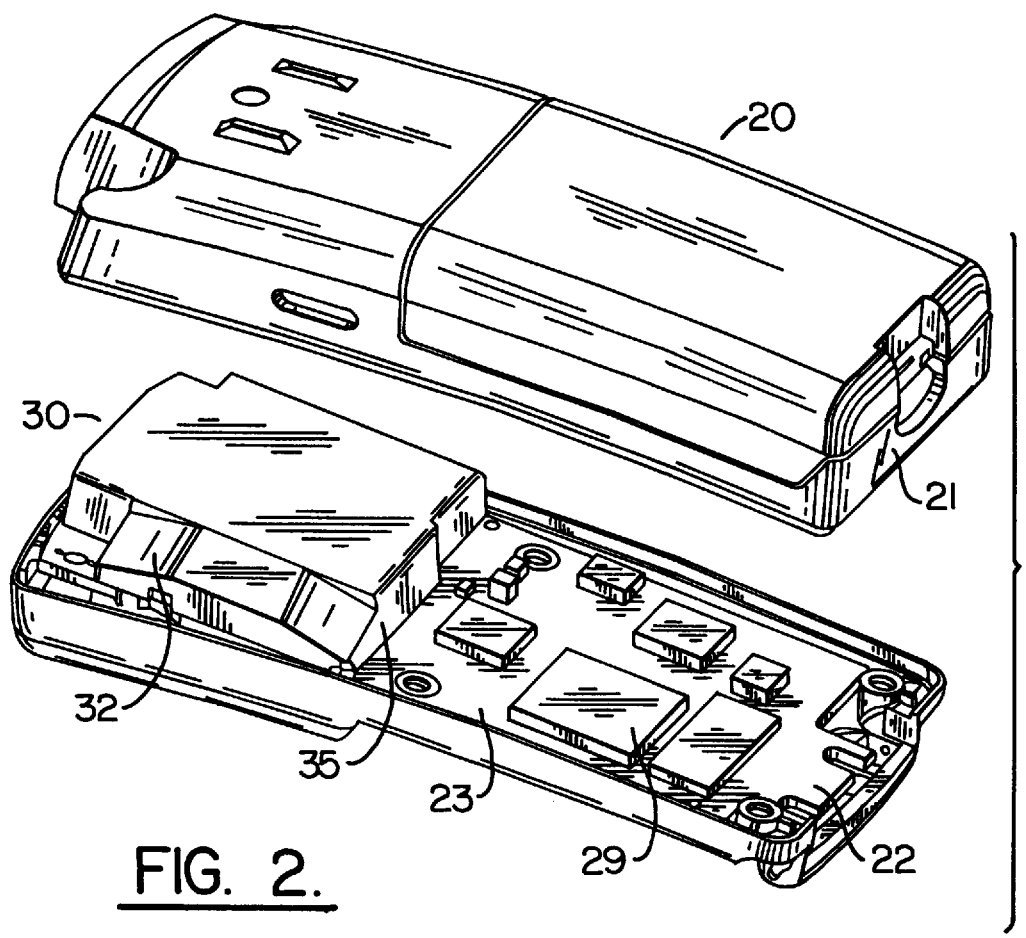
FIG. 2 is a perspective view of an electronic device including a housing surrounding the shield releasably mounted on the circuit board of FIG. 1.

Referring now to FIGS. 1 to 6, a shield 30 is illustrated for shielding electronic components 24 on an electronic substrate 22. The electronic substrate is illustrated, for exemplary purposes, as a printed circuit board 22 (FIG. 1). The shield 30 is connected on the printed circuit board 22 to form an electronic package 25 (FIG. 1). The electronic package 25 is enclosed in a housing 21 producing an electronic device illustrated for exemplary purposes as a cellular phone 20 (FIG. 2). Various other electronic packages including pagers, portable compact disk players, and the like, can be provided with components shielded by the shield 30.

The printed circuit board 22 has a first or upper surface 23 and a second or lower surface 26 opposite the upper surface 23 (FIG. 1). The circuit board 22 may be a multi-layered circuit board including a ground plane 27 connected on the upper surface 23 and, preferably, ground planes at various layers (FIG. 3).

Figure 3:
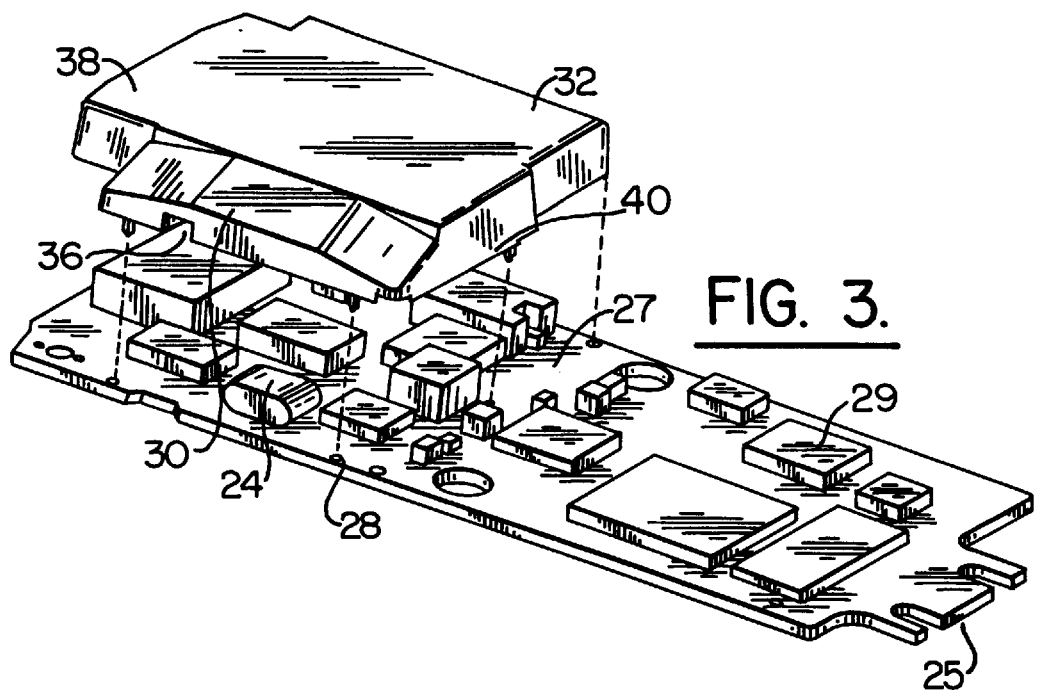
FIG. 3 is an exploded perspective view of the shield of FIG. 1 disconnected from the circuit board of FIG. 1.

Referring now to FIG. 3, the circuit board 22 also includes holes 28 positioned in the upper surface 23 and extending through the substrate 22 to be exposed on the lower surface 26. The holes 28 are configured having a size and shape sufficient to receive and releasably connect with mounting pins 40 on the shield 30 when the pins 40 are inserted therein. These holes 28 are also configured to repeatedly receive the pins 40 of the shield 30 if insertion, removal and reinsertion of the same shield is desired.

A plurality of electronic components 22 are also mounted on the upper surface 23 of the circuit board 22 (FIGS. 1–3). Other configurations of electronic circuit boards 22 and other electronic substrates, including glass or ceramic substrates, can be provided to connect with the shield 30 in forming an electronic package.

Figure 4:
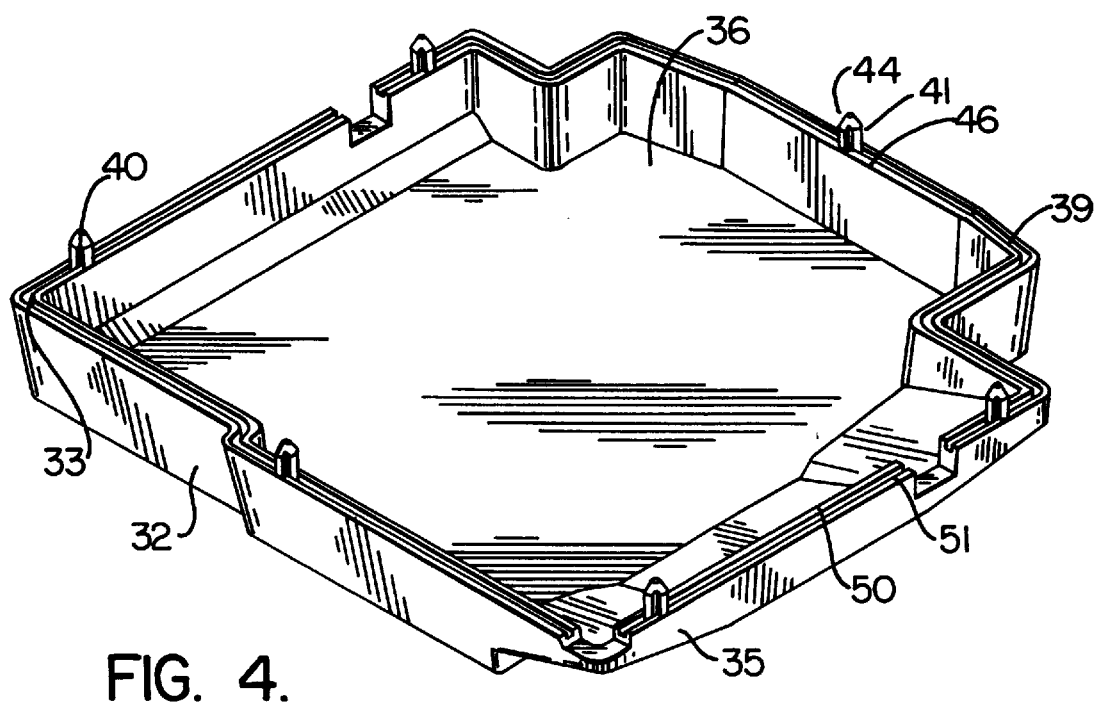
FIG. 4 is a perspective view of the shield of FIG. 1.
Figure 5:
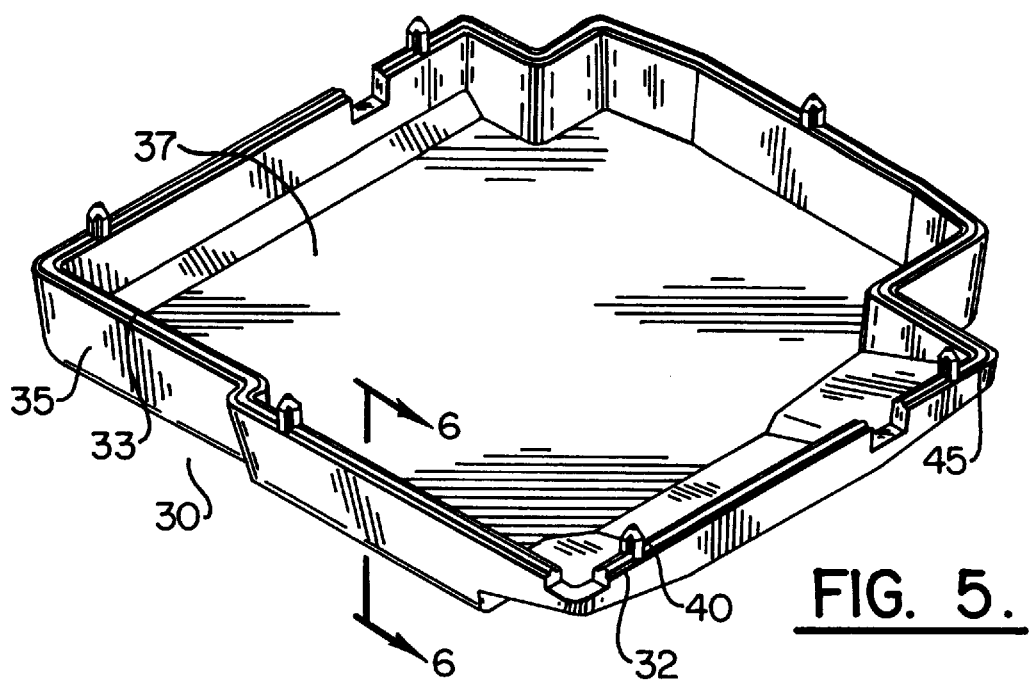
FIG. 5 is a perspective view of the shield of FIG. 1 and a gasket connected therein.
Figure 6:
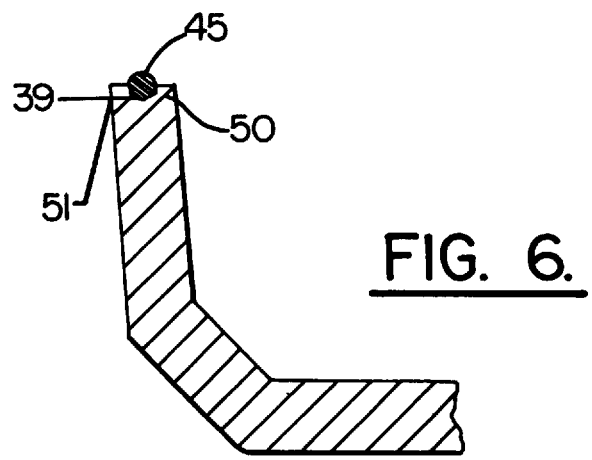
FIG. 6 is a cross-sectional view of the shield with a gasket inserted therein taken along line 6—6 of FIG. 5.

Referring to FIGS. 1 to 6, the shield 30 includes a conductive cover 32 and includes a plurality of conductive mounting pins 40 connected with and extending transverse from the peripheral end portion 33 of the cover 32. The shield 30 also preferably includes a conductive gasket 45 connected with and electrically coupled with the cover 32 and the substrate 22 (FIG. 5). The gasket 45 is preferably disposed on the peripheral end portion 33 of the cover 32 (FIGS. 5 and 6).

More specifically referring to FIGS. 1 to 5, the conductive cover 32 includes a roof portion 34 and a wall portion 35 extending generally transverse from the roof portion 34. The wall portion 35 includes a peripheral end portion 33 distal from the roof portion 34.

The roof portion 34 and wall portion 35 together define an inner cavity 36 (FIG. 4). The inner cavity 36 is configured and sized to receive an electronic component 24, and preferably, a plurality of electronic components 24 therein, when the shield 30 is mounted on the printed circuit board 22. The peripheral end portion 33 defines the opening boundary of the inner cavity 36 of the cover 32. As shown in FIG. 3, a plurality of components 24 are positioned within the inner cavity 36 of the cover 32.

A plurality of components 29 are also mounted on the upper surface 23 of the circuit board 22 outside the inner cavity 36 of the cover 30 (FIGS. 1 to 3). Alternatively, the shield 30 can be provided in various configurations and sizes which provide an inner cavity or cavities which can house a variety of configurations, numbers or sizes of components therein. For example, a shield can be sized to house all of the components, a portion of the components or a single component mounted on a substrate. Further, a plurality of shields 30 can be utilized to shield components on the electronic substrate. Multiple shields also can be connected on opposite sides of a substrate for shielding.

Preferably, the cover 32, including the roof portion 34 and wall portion 35, can be formed of a polymer material having a conductive inner surface 37. The cover 32 is preferably formed of an injection molded polymer or plastic resin. The conductive surface is created by applying a metallized surface onto the polymer by electroplating, or alternatively, by electroless plating, by vacuum metallization, or by applying a conductive paint.

The cover 32 can be provided with both the inner surface 37 and an outer surface 38 metallized or conductively treated, or the outer surface 38 alone metallized or conductively treated. The pins 40 are also preferably formed of a polymer material with a metallized outer surface applied. The metallized inner surface 37 and metallized pins 40 provide the ground connection of the shield 30 with the electronic substrate 22. The cover 32, pins 40 and gasket can be formed of various conductive material or can include a conducting coating surrounding a non-conductive material.

The cover 32 and pins 40 are preferably formed as a single integral piece by polymer molding or shape forming processes known to one of ordinary skill in the art. The cover 32 and/or the pins 40 can be formed of other materials having sufficient conductive properties or having a sufficiently conductive coating or additive. The shield 30 can be injection molded of a polymer or plastic material having a conductive filler imbedded in the plastic. Suitable filler materials can include aluminum and silver particles or metal coated fibers. Such shields would not require plating. Preferably such fillers can constitute up to about 30 of the weight of the material in order to maintain flow characteristics suitable for molding. A further alternative shield can be provided formed of a cast metal having integral pins produced by a die-casting operation. The process of such die-casting operations are known to one of ordinary skill in the art and are not discussed in detail herein.

The pins 40 and cover 32 can also be manufactured by other methods depending on the desired shape or size. In alternative embodiments, the cover 32 can be formed of multiple pieces which matingly connect prior to insertion in the electronic substrate. For example, a two piece cover can be provided by snap-fitting two halves connected join across the center of the cover prior to insertion on the electronic substrate.

Referring now to FIG. 4, the conductive mounting pins 40 extend from the peripheral end portion 33 of the cover 32. The pins 40 are preferably molded with the cover 32 to form an integral shield part 30. Such pins 40 can be provided as separate pieces which connect with the cover 32 in various configurations. For example, alternatively, the pins can be inserted into holes in the cover, or bonded or soldered to the cover.

As illustrated in FIGS. 3 and 4, the pins 40 include a body 41 having a cross-shaped section extending laterally from the peripheral end portion 33 of the wall 35. The pins 40 taper from a proximal end 46 adjacent the cover 32 to a distal end 44 opposite the proximal end 46 and distal from the cover 32. Such a tapered configuration facilitates insertion of the pins 40 into the holes 28 of the circuit board 22. The pins 40 having a tapered end 42 and cross-section to facilitate insertion of the cover 32 into the circuit board 22 in a self-locating manner (FIG. 3). The cross-shaped geometry of the pins 40 illustrated in FIG. 4 lowers the press-fit insertion forces during installation which limits the deformation of the pins 40 and prevents deformation in the mating holes 28 of the substrate 22. The pins can be provided having a generally smooth body or with bodies of various other configurations to provide increased strength and retention in the circuit board as required.

Still referring to FIGS. 1 to 5, the inner cavity 36 has a volume and shape configured to receive and enclose the predetermined plurality of components 24 between the inner cavity 36 and the printed circuit board 22 when the shield 30 is mounted on the printed circuit board 22. Various configurations of shields 30 can be provided to accommodate a variety of types, shapes, and sizes of electronic components.

As illustrated in FIG. 3, the shield 30 is inserted into the upper surface 23 of the circuit board 22 by aligning and inserting the pins 40 of the shield 30 in their respective holes 28 of the circuit board 22. The pins 40 insert in a press-fitting connection into the circuit board 22. The pins 40 maintain the cover 32 in contact with the printed circuit board 22 through a solder-free press-fit connection. Thus, neither solder nor other mechanical fasteners are necessary to connect the shield 30 to the circuit board 22. When the shield 30 is inserted in the circuit board 22, the pins 40 contact the ground plane of the printed circuit board 22 on upper surface 23 as well as ground planes in other layers. Alternatively, the pins can be positioned to contact ground planes at various layers within the circuit board.

Referring now to FIGS. 4 to 6, the shield 30 also includes an inner lip 50 which extends transversely from the peripheral end 33 of the wall 35. The inner lip 50 extends around a portion of the peripheral end 33 of the wall 35. The inner lip 50 forms the inner edge of the inner cavity 36. The outer lip 51 extends generally parallel to the inner lip 50 forming a groove 39 in the peripheral end 33 of the cover 32. The groove 39 extends generally along a substantial portion of the peripheral end 33 of the cover 32.

As shown in FIGS. 5 and 6, the gasket 45 is inserted in the groove 39. The elongated gasket 45 is preferably formed of an elastomeric, conductive material, for example, a filled silicon rubber compound, other silicon resins, or the like. The gasket 45 is applied as a bead and dispersed into the groove 39. The gasket 45 can be provided, alternatively, as an over-molded gasket for the shield.

The gasket 45 is preferably connected between the cover 32 and the ground plane of the circuit board 22. The gasket 45 is installed on the cover 32 by dispensing or, alternatively, molding a conductive bead onto the cover 32. When the shield 30 is connected on the circuit board 22, the gasket 45 preferably contacts and electrically couples the ground plane of the circuit board 22 with the shield 30. The shield can be provided with devices or materials, for example, conductive adhesive, between the shield and the substrate to assist in forming an electrical connection between the shield and the substrate. In the event no intermediate devices or materials are provided between the gasket 45 and the surfaces of the shield cover 32 and the substrate 22, the gasket 45 provides direct electrical connection between the shield 30 and the substrate 22.

Figure 7:
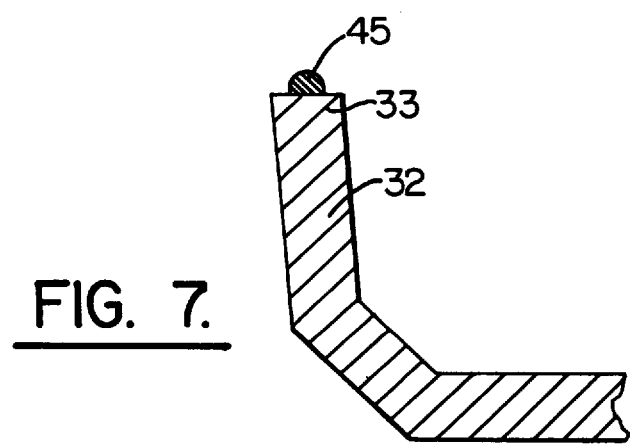
FIG. 7 is a cross-sectional view of an alternative embodiment of the shield, similar to the view of FIG. 6.

Referring to FIG. 7, an alternative embodiment of the shield 30 can be provided with a gasket 45 connected with the peripheral end 33 of the cover 32. The peripheral end 33 includes a generally planar edge which does not contain a groove as described with respect to FIG. 6. The gasket 45 is connected, in FIG. 7, between the peripheral end 33 and the substrate 22 to contact and electrically couple the shield 30 and the substrate 22.

Referring again to FIGS. 1-6, in various applications, the shield 40 is of a small size such that it may be difficult, due to manufacturing tolerances, to produce a peripheral end 33 of the cover 32 which will continuously contact the upper surface 23 of the circuit board 22. Gaps can result in the cover 32 and circuit board 22 which cause a break in the grounding between the cover 32 and the circuit board 22. The elongated conductive elastomeric gasket 45 connected in the groove as illustrated in FIGS. 5–6 and protrudes from the groove 45 to contact the upper surface 23 of the circuit board 22 and fill any such gaps regardless of imperfections in the surface 23 of the circuit board 22 or the lower end of the periphery of the cover 32. The gasket 45 thus electrically couples the cover 32 with the shield 30 and provides a generally continuous ground around the periphery of the cover 32 and the shield 30.

Likewise, the gasket 45 connected with the peripheral end 33 of FIG. 7 also protrudes from the peripheral end portion 33 and contacts the upper surface 23 of the circuit board 22 to fill any such gaps and electrically couple the cover 32 with the shield 30. This also provides a generally continuous ground around the periphery of the cover 32 and the shield 30.

Alternatively, the cover could be provided without the gasket 45 and with other conductive sealing mechanisms connected with the cover 32 prior to assembly. The gasket 45 facilitates assembly of the shield 30 with the electronic substrate 32 by being easily inserted onto the cover 32 or, alternatively, into the groove, prior to assembly. The gasket 45 does not require additional handling or increase the difficulty of inserting of the cover 32 into the circuit board 22 or of assembling an electronic package 25 or electronic device 20.

The pins 40 of the shield 32 preferably extend through the height of the layers of the circuit board 40 defined by the distance between the upper surface 23 and lower surface 26 of the circuit board 22. When fully inserted, the pins 40 are exposed on the lower surface 26 of the circuit board 22. The shield 30 is easily removed by contacting the distal end 44 of the pins 40 to push the pins 40 in a removal direction opposite the direction of insertion. Contacting the distal end 44 of the pins 40 ejects them from the circuit board 22. As the pins 40 are preferably maintained only by a press-fit connection, with no solder or other mechanical fasteners, the shield 40 can easily be removed from and reinserted into the substrate circuit board 22 or other electronic substrate. Alternatively, having removed the shield 30, a replacement shield can be reinserted into the holes 28 of the substrate circuit board 22.

Figure 8:
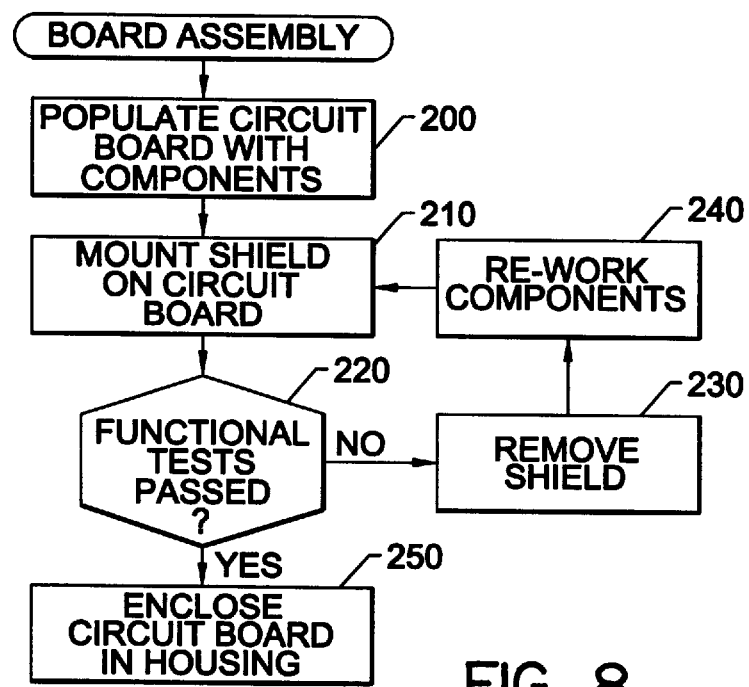
FIG. 8 is a schematic of methods of assembling a shield on a populated circuit board of an electronic device according to the present invention.

Referring now to FIG. 8, an embodiment of methods of assembling the electronic device having an electronic package including a shield is described. The electronic package 25 comprising the circuit board 22 and shield 30 can easily be assembled as described herein. The circuit board 22 or other electronic substrate is populated on its upper surface 23 with a plurality of electronic components 24 and 29 (Block 200). Next, as shown in Block 210, a shield 30 as described is inserted into the circuit board 22 by preferably press-fittingly inserting the pins 40 of the shield 30 into the upper surface 23 of the electronic substrate 22 providing a press-fit connection. At least one electronic component 24 is positioned in the inner cavity 36 of the shield 30. As shown in FIG. 3, a plurality of components 24 is positioned within the shield 30 and a plurality of components 24 is positioned outside the shield 30. Various configurations and shapes of shields can be provided for use with the methods described herein.

As described, the shield 30 can preferably be removed by contacting the distal end 44 of the pins 40 from the lower surface 26 of the electronic substrate 22 and pushing the pins 40 in a direction opposite from the direction of insertion. Removing the shield 30 may not detrimentally affect the structure of the shield 30. The shield 30 can be inserted, removed, reinserted repeatedly in the same electronic substrate 22 or, alternatively, a different substrate. Thus, the shield 30 according to the present invention reduces waste as the solder or mechanical fasteners of other shields are eliminated. The shields 30 also can be re-used if a particular electronic substrate 22 fails testing and reworking is needed. Additionally alternatively, a new shield can be reinserted into the substrate.

Referring again to FIG. 8, functional tests can be performed. If failed (Block 220), the shield 30 can be removed (Block 240), the component 22 reworked (Block 240), and the shield 30 replaced and reinserted into the substrate 22 (Block 220) or a new shield reinserted. Further, preferably, the inserting step comprises inserting the cover 32 into the electronic substrate 22 such that the gasket 45 contacts a ground plane of the electronic substrate 22. Once functional tests are passed (Block 220) the circuit board is enclosed in a housing (Block 250).

Alternative configurations of the shield 30 can be utilized with the methods according to the present invention. Such alternative configurations of the shield can provide alternative methods of inserting and removing the shield 30 with the present invention.

Methods according to the present invention provide for simple assembly of an electronic package 25 and electronic device 20. A single self-contained shield 30 is easily press-fit inserted into the surface 23 of the substrate 22. As described with respect to the shield 30, the self-locating pins 40 facilitate the inserting step.

Further, the lack of solder or additional mechanical fasteners can reduce the space required between the inner boundary of the shield 30 and the electronic component 22.

The shield 30 and methods of assembling the electronic package 25 and device 20 also can eliminate concerns about migrating solder and concurrent damage to electronic components resulting from soldering in previous shields. Further, the electronic package 25 provided can be tested with the shield 30 inserted on the electronic substrate 22, and does not require the housing 21 of the device 20 to be provided for testing with certain of the prior housing shields. Thus, the shields and methods of assembling the same allow for the production of electronic packages 25 which can be stored and used in a variety of resulting electronic devices.

In the drawings and specification, there has been set forth a preferred embodiment of the invention and, although specific terms are employed, the terms are used in a generic and descriptive sense only and not for purposes of limitation, the scope of the invention being set forth in the following claims.

That which is claimed:

1. A shield that shield electronic components on an electronic substrate comprising:
    a conductive cover with a roof and side walls which defines a cavity configured to receive at least one electronic component positioned therein, said side walls including a peripheral end opposite said roof, and defining an outer boundary of said cavity, wherein said side walls define a substantially continuous uninterrupted cover perimeter;
    a conductive gasket connected to said cover peripheral end;
    a plurality of conductive mounting pins integral with and extending from said peripheral end of said cover, said pins having a cross-shaped section between said peripheral end of said cover and a proximal end adjacent said cover and configured to form a solder-free connection with a surface of an electronic substrate and to releasably, electrically contact a ground plane of the electronic substrate;
    wherein each of said pins has a greater cross-sectional area in said proximal end adjacent said cover than a cross-sectional area in an opposite distal end, said cross-sectional areas of each of said distal end portions being smaller than cross-sectional areas of respective prearranged holes in said electronic substrate such that said pins are configured to self-locatingly press-fittingly insert in said prearranged holes in said electronic substrate; and
    wherein the cross-shaped section of each pin has an undeformed configuration when not inserted in a respective one of said prearranged holes and a deformed configuration when inserted in a respective one of said prearranged holes.

2. A shield as defined in claim 1, wherein the conductive cover defines a groove in the peripheral end and said gasket is connected in said groove.

3. A shield according to claim 1, wherein said pins are configured to extend through the electronic substrate such that ends of said pins are accessible for removal of said shield from the electronic substrate.

4. A shield according to claim 3, wherein said pins are tapered pins.

5. A shield according to claim 4, wherein said pins are rigid.

6. A shield according to claim 1, wherein said pins and said conductive cover are formed of a metallized polymer material.

7. A shield as defined in claim 1, wherein said conductive cover and said pins are integrally formed as a single piece.

8. A shield according to claim 1, wherein said roof is continuous.

9. A shield for an electrical component for use in an electronic device comprising:
    an electronic substrate
    a conductive cover including,
        a roof, and
        a wall integrally formed with said roof, said wall defining a peripheral end portion of said cover, said cover defining an inner cavity configured to receive at least one electrical component therein;
    a plurality of conductive mounting pins integral with and extending from said wall peripheral end portion, said pins configured to form a solder-free connection with a surface of an electronic substrate and to releasably, electrically contact a ground plane of the electronic substrate said pins having a cross-shaped section between said wall peripheral end portion and a proximal end adjacent said cover;
    a conductive gasket connected with said peripheral end portion of said cover, said gasket configured to electrically couple the surface of the electronic substrate to the covert
    wherein each of said pins has a greater cross-sectional area in said proximal end adjacent said wall than a cross-sectional area in said opposite distal end, said cross-sectional areas of each of said distal end portions being smaller than cross-sectional areas of respective prearranged holes in said electronic substrate such that said pins are configured to self-locatingly press-fittingly insert in said prearranged holes in said electronic substrate; and
    wherein the cross-shaped section of each sin has an undeformed configuration when not inserted in a respective one of said prearranged holes and a deformed configuration when inserted in a respective one of said prearranged holes.

10. A shield as defined in claim 9, wherein said peripheral end portion includes a groove, and wherein said gasket is disposed in said groove.

11. A shield according to claim 10, wherein said pins are configured to extend through of said electronic substrate such that ends of said pins are accessible for removal of said shield from said electronic substrate.

12. A shield according to claim 9, wherein said pins and said conductive cover are formed of a metallized polymer material.

13. A shield as defined in claim 9, wherein said conductive cover said wall and said pins are integrally formed as a single piece.

14. An electronic package according to claim 7, wherein said roof is continuous.

15. An electronic package according to claim 9, wherein said pins are tapered pins.

16. An electronic package according to claim 15, wherein said pins are rigid.

17. An electronic package comprising:
    an electronic substrate including,
        a first surface,
        a plurality of electronic components on said first surface,
        a second surface opposite the first surface, and
        a ground plane;
    a shield releasably press-fit inserted into said first surface of said electronic substrate, said shield including:
        a conductive cover having a roof and a bottom peripheral edge which defines a cavity having at least one of said plurality of said electronic components positioned in said cavity;

a conductive gasket connected between said bottom peripheral edge and said electronic substrate; and a plurality of conductive mounting pins integral with and extending from the bottom peripheral edge of said cover, said pins having a cross-shaped section between said bottom peripheral edge and a proximal end adjacent said cover, said pins inserted into said first surface of said electronic substrate in a solder-free connection and electrically contacting said ground plane of said electronic substrate, and wherein the cross-shaped section of each Pin has an undeformed configuration when not inserted in said first surface of said electronic substrate and a deformed configuration when inserted in said first surface of said electronic substrate.

18. An electronic package as defined in claim 17, wherein said cover defines a groove in the peripheral end and said gasket is connected in said groove.

19. An electronic package as defined in claim 17, where said pins extend through a height of the electronic substrate such that lower ends of said pins are accessible on said second surface for contacting said pins for removal of said shield from said electronic substrate, said height defined as the distance between said first surface and said second surface.

20. An electronic package as defined in claim 17, wherein said pins and said conductive cover are formed of a metallized polymer material.

21. An electronic package as defined in claim 17, wherein said conductive cover and said pins are integrally formed as a single piece.

22. An electronic package as defined in claim 17, in combination with a housing surrounding said package to provide an electronic device.

23. A shield according to claim 17, wherein said roof is continuous.

24. An electronic package according to claim 17, wherein said pins are tapered pins.

25. An electronic package according to claim 24, wherein said tapered pins are rigid.

* * * * *

UNITED STATES PATENT AND TRADEMARK OFFICE
CERTIFICATE OF CORRECTION

PATENT NO. : 5,847,938
DATED : December 8, 1998
INVENTOR(S) : John Weldon Gammon It is certified that error appears in the above-identified patent and that said Letters Patent is hereby corrected as shown below:

| | |
|---|---|
| Column 9, line 19 | Please delete the second occurrence of "shield" and substitute -- shields -- therefor. |
| Column 10, line 22 | Please delete "covert" and substitute -- cover; -- therefor. |
| Column 11, line 13 | Please delete "Pin" and substitute -- pin -- therefor. |

Signed and Sealed this

Sixth Day of July, 1999

Attest:

Q. TODD DICKINSON

*Attesting Officer*     Acting Commissioner of Patents and Trademarks